United States Patent [19]

Metcalf et al.

[11] 4,377,782
[45] Mar. 22, 1983

[54] FAULT LOCATION METHODS AND APPARATUS USING CURRENT PULSE INJECTION

[75] Inventors: Eric Metcalf, Ropley; Jack Woollven, Hawley; Stephen N. Spens, Farnham; Brian L. A. Kett, Lower Parkstone, all of England

[73] Assignee: Membrain Limited, Wimborne, England

[21] Appl. No.: 161,485

[22] Filed: Jun. 20, 1980

[30] Foreign Application Priority Data

Jun. 23, 1979 [GB] United Kingdom ............... 7921940

[51] Int. Cl.³ ................... G01R 31/08; G01R 31/28
[52] U.S. Cl. ............................... 324/52; 324/73 PC
[58] Field of Search ................ 324/52, 73 R, 73 PC, 324/133

[56] References Cited

U.S. PATENT DOCUMENTS

| 3,753,089 | 8/1973 | Gunn et al. ............... | 324/133 X |
| 3,986,116 | 10/1976 | Smith et al. ............... | 324/52 X |
| 4,074,188 | 2/1978 | Boatman et al. ............... | 324/52 |
| 4,115,731 | 9/1978 | Axtell ............... | 324/52 |
| 4,186,338 | 1/1980 | Fichtenbaum ............... | 324/52 |

FOREIGN PATENT DOCUMENTS

| 2050705 | 4/1971 | Fed. Rep. of Germany ........ | 324/52 |
| 2443716 | 3/1976 | Fed. Rep. of Germany . | |

OTHER PUBLICATIONS

Beckwith et al., "Tracing Current by Inductive Pickup Tracks Logic Faults Precisely" *Electronics*, vol. 49, No. 25, pp. 106-110, Nov. 25, 1976.

Weston Instruments Model 670 "In-Circuit Tester" Operation Manual.

Beckwith, J. F. "Current Tracer: A New Way to Find Low Impedance Logic-Circuit Faults", Hewlett Packard Brochure pp. 2-8.

Hoffman et al. "A Technique for Precise Fault Diagnosis on Devie-Laden Buses of LSI Boards," Teradyne Inc. Sep. 1978, pp. 371-376.

Bernd Pohlmann and Dieter Giesbrecht, "Schnelle Fehlerdiagnose an bestuckten Leiterplatten", *Elektronik*, vol. 28, No. 5., (1979.03), pp. 53-56.

*Primary Examiner*—Gerard R. Strecker
*Attorney, Agent, or Firm*—Dale Gaudier

[57] ABSTRACT

A probe for sensing direction of flow of an injected current pulse along a conductor of a circuit under test is linked to an ATE, to be triggered to inject the pulse during a test sequence at a step previously found by the ATE to establish a faulty state in the circuit. Thus, the faulty one of several components connected to a circuit node can be identified. The probe itself can also be used independently, and injects an approximately triangular-waveform current pulse which has a steep rising edge and a less steep falling edge, thereby inducing a voltage pulse which is asymmetric about the zero voltage level and thus permits discrimination of the direction of current flow. The probe may have a single current injection contact disposed between the limbs of a bifurcated core for the pick-up coil.

10 Claims, 4 Drawing Figures

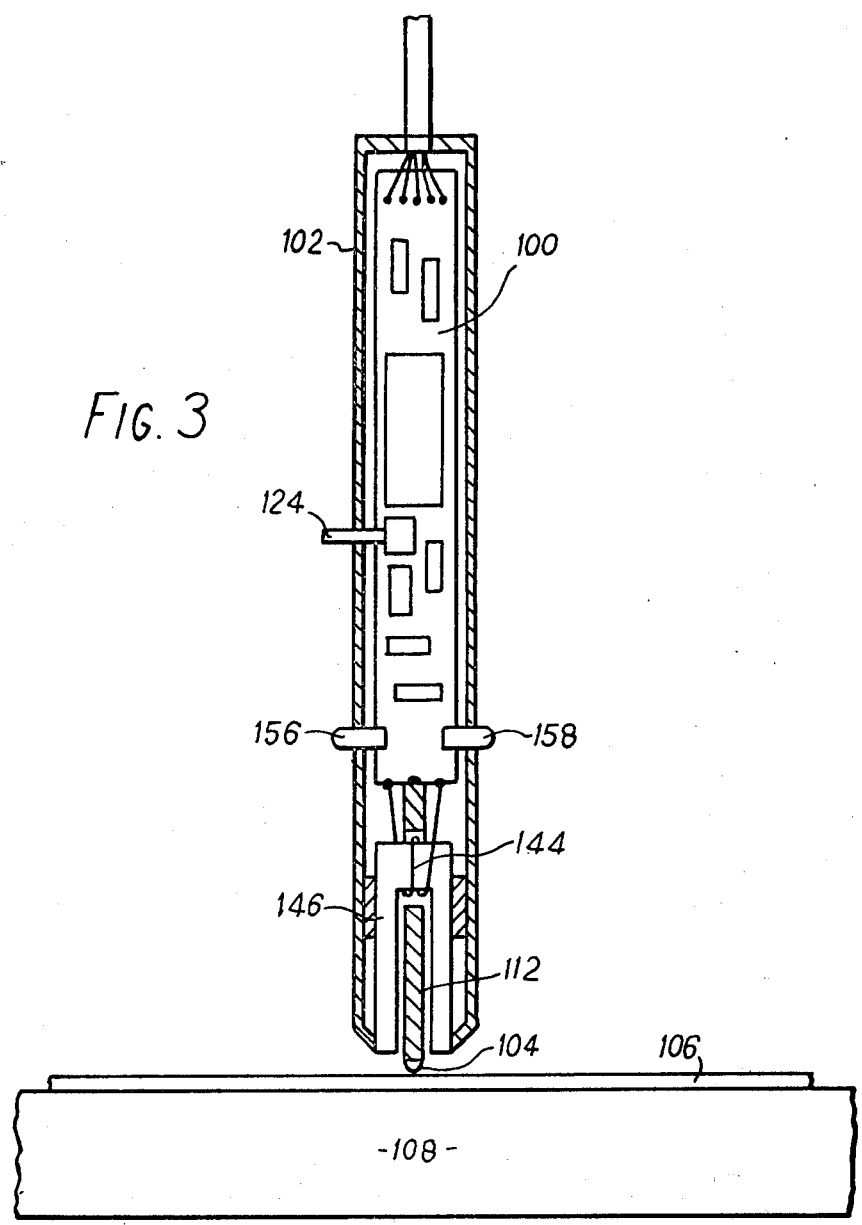

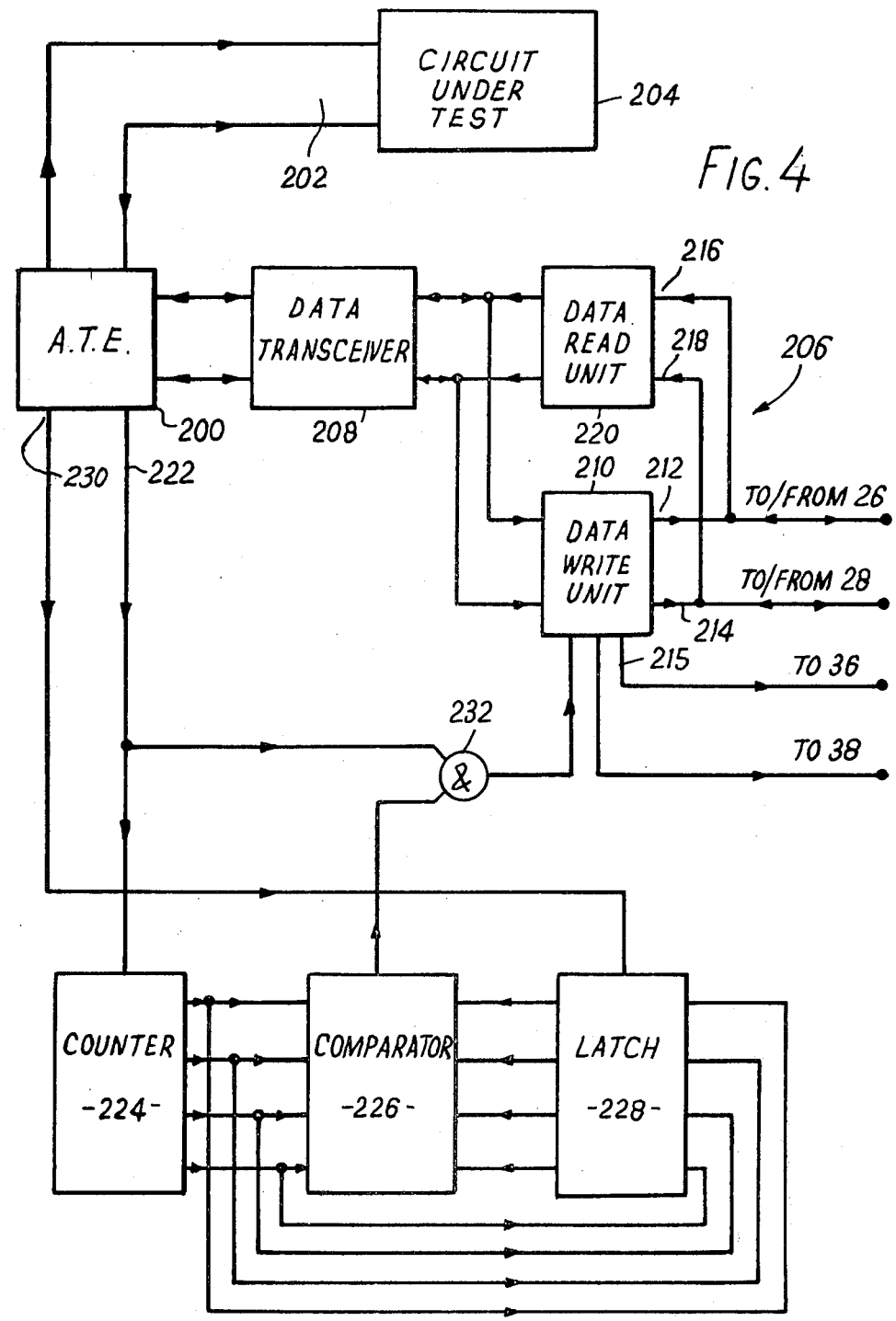

FAULT LOCATION METHODS AND APPARATUS USING CURRENT PULSE INJECTION

CROSS-REFERENCE TO RELATED APPLICATION

This application is related to application Ser. No. 161,484 filed June 20, 1980, now U.S. Pat. No. 4,345,201, entitled FAULT LOCATION SYSTEM WITH ENHANCED NOISE IMMUNITY, and assigned to the assignee of the present application.

This invention relates to methods and apparatus for locating faults in electronic circuits.

In one method for the automatic testing of complex digital circuits, a sequence of test signals is applied to the circuit under test, so as to rapidly cycle the circuit through a large number of its possible operating states. The response of the circuit to the test signals is continuously monitored during their application, in order to check for faults. Once the existence of a fault has been established, it is usually then desired to locate the precise position of the fault within the circuit, so that the circuit can be repaired.

A known method of locating the fault is to set the circuit to the particular operating state in which the fault appeared, and then to use a probe to measure various parameters within the circuit. However, this method suffers from the drawback that for some circuits in some circumstances, the particular operating state in which the fault appeared is a transient state, so that it is not possible to set the circuit to this state.

It is an object of the present invention in two of its aspects to provide automatic testing methods and apparatus in which the aforementioned drawback is substantially overcome. It is a further object of the invention, in two more of its aspects, to provide an improved current probing technique for use with such automatic testing methods and apparatus in locating faults.

According to one aspect of the present invention, there is provided a method of testing a powered electronic circuit, the method comprising:

applying a sequence of test signals to said circuit;

storing, in response to the detection of a fault in said circuit during the application of said sequence of test signals, the number of the step in said sequence at which the fault occurred;

repeating the application of said sequence of test signals to the circuit while applying current pulse applying means to a conductor of the circuit associated with the fault;

automatically triggering said current pulse applying means to apply a current pulse of predetermined sense to said conductor when said sequence reaches the step whose number was stored; and determining the direction of flow of said current pulse along the conductor, whereby to permit the determination of the direction of the fault with respect to the point on the conductor at which the pulse is applied.

Preferably, the current pulse has an approximately triangular waveform with a relatively steep leading edge and a relatively less steep trailing edge, and the step of determining the direction of flow of said current pulse along the conductor comprises sensing magnetic field changes induced adjacent to said conductor by the leading edge of said pulse, and producing, in response to the sense of said magnetic field changes, a signal indicative of said direction of flow.

According to another aspect of the invention, there is provided a method for locating a fault in a powered electronic circuit, the method comprising:

applying to a conductor of said circuit a pulse of current of predetermined sense and having an approximately triangular waveform with a relatively steep leading edge and a relatively less steep trailing edge;

sensing magnetic field changes induced adjacent to said conductor by said leading edge of said pulse; and producing, in response to the sense of said magnetic field changes, a signal indicative of the direction of flow of said current pulse along said conductor, whereby to permit the determination of the direction of said fault relative to the point on said conductor at which said pulse is applied.

In both of these first two aspects of the invention, the methods preferably further include automatically effecting said determination of the direction of the fault in response to the predetermined sense of said current pulse and the direction of flow thereof along the conductor.

According to yet another aspect of the invention, there is provided apparatus for testing a powered electronic circuit, the apparatus comprising:

means for applying a sequence of test signals to said circuit;

means for storing, in response to the detection of a fault in said circuit during the application of said sequence of test signals, the number of the step in said sequence at which the fault occurred;

means for applying a current pulse of predetermined sense to a conductor of the circuit associated with the fault;

means for triggering the current pulse applying means to apply such a pulse when said sequence, during a subsequent application thereof to the circuit, reaches the step whose number was stored; and means for determining the direction of flow of said current pulse along the conductor, whereby to permit the determination of the direction of the fault with respect to the point on the conductor at which the pulse is applied.

The current pulse again preferably has an approximately triangular waveform with a relatively steep leading edge and a relatively less steep trailing edge, and the means for determining the direction of current flow preferably comprises means arranged to sense magnetic field changes induced adjacent to said conductor by the leading edge of said pulse and means responsive to the sense of said magnetic field changes to produce a signal indicative of said direction of current flow.

According to a yet further aspect of the invention, there is provided apparatus for locating a fault in a powered electronic circuit, the apparatus comprising:

means arranged to apply to a conductor of said circuit a pulse of current of predetermined sense and having an approximately triangular waveform with a relatively steep leading edge and a relatively less steep trailing edge;

means arranged to sense magnetic field changes induced adjacent to said conductor by said leading edge of said pulse; and means responsive to the sense of said magnetic field changes to produce a signal indicative of the direction of flow of said current pulse along said conductor, whereby to permit the determination of the direction of said fault relative to the point on said conductor at which said pulse is applied.

The apparatus of each of these last two aspects of the invention preferably further includes means responsive to the predetermined sense of said current pulse and the direction of flow thereof along the conductor to determine, and preferably indicate, the direction of the fault.

The current pulse applying means preferably includes a differentiating circuit arranged to produce said triangular waveform at its output in response to a step signal at its input.

Advantageously, the sensing means comprises a coil wound upon a bifurcated core, and the current pulse applying means comprises a conductive member disposed between the limbs of said core.

In all aspects of the invention, the magnitude of said current pulse is preferably selected to be insufficient to alter the logical state of said circuit.

The invention will now be described, by way of example only, with reference to the accompanying drawings, of which:

FIG. 3 is a sectional view of one form of probe forming part of the apparatus of FIG. 1; and FIG. 4 is a schematic block diagram of automatic test equipment in accordance with the present invention and adapted to incorporate the apparatus of FIGS. 1 and 3.

The apparatus to be described is intended for use in fault location on assembled printed circuit boards. In conventional testing of such a board carrying, for example, a complex digital logic circuit, power is supplied to the circuit via an edge connector on the board, and test signals are then applied in a predetermined sequence to the circuit so that it adopts various different logical states. For each such state, electrical voltages at various points in the circuit are sensed and their logic values (or combinations thereof) are compared with predetermined values (or combinations thereof) that would be expected during normal, fault-free operation of the circuit. Any departure from these expected values indicates a fault in the circuit.

Typically, the fault may be a short-circuit (or a component failure whose effect is similar to a short-circuit) between the point, such as a printed circuit conductive track, where the incorrect voltage is observed and either the power supply rail or the power return rail of the circuit. If the point is a circuit node, to which several different components are coupled, simple measurement of the node voltage does not permit the faulty component to be identified. However, injection of a test pulse of current into the node can resolve this difficulty.

Figure 1:
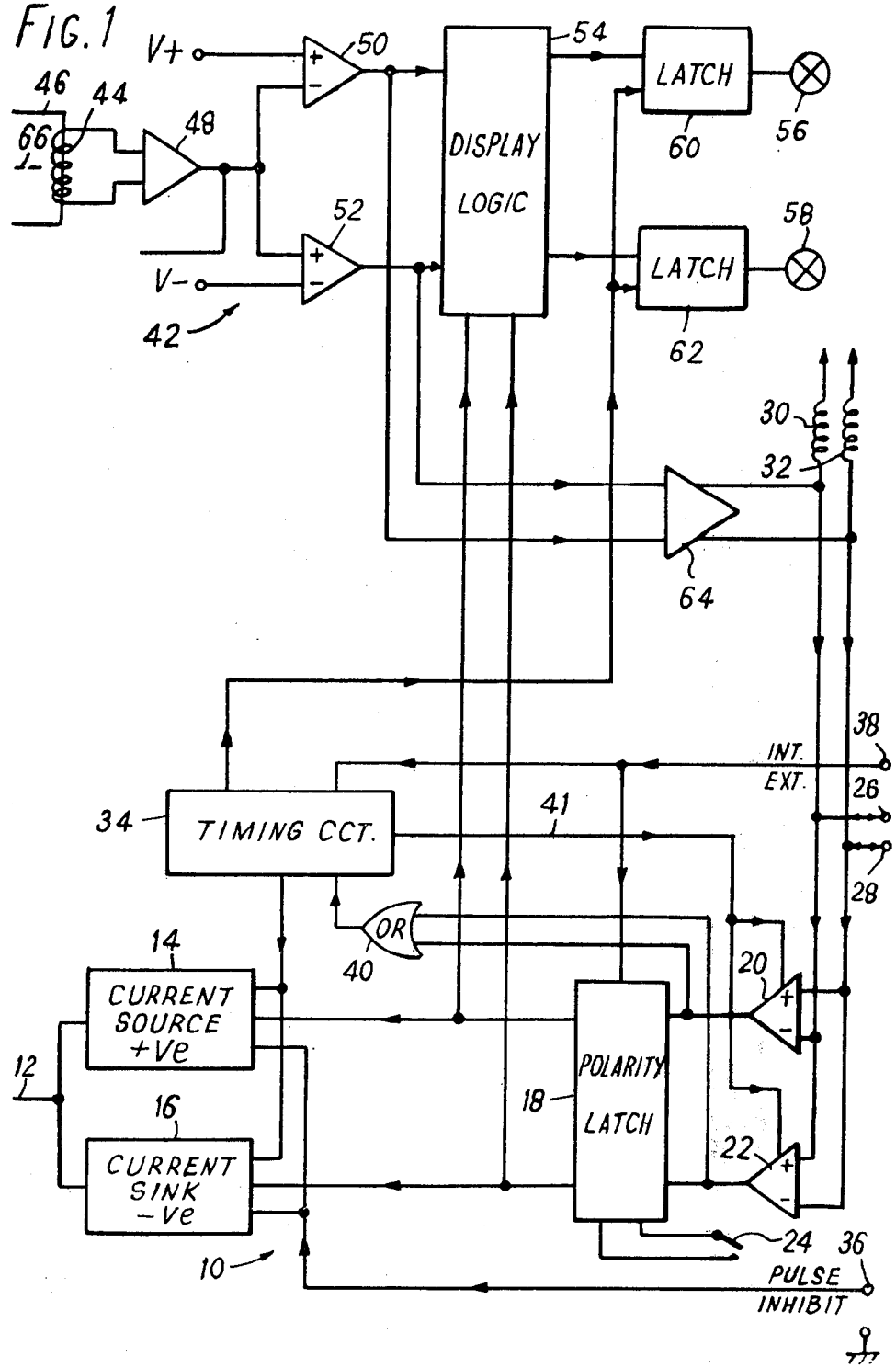
FIG. 1 is a block schematic circuit diagram of fault locating apparatus in accordance with the present invention.

Accordingly, and as shown in FIG. 1, the apparatus includes a current supply circuit 10, which has a current injection probe 12 coupled to a current source 14 and a current sink 16. For testing a circuit in which the power supply rail is, as is usual, positive with respect to the power return rail, the current source 14 is arranged to supply positive-going current pulses and the current sink 16 is arranged to supply negative-going current pulses. Selection of either the current source 14 or the current sink 16 is controlled by a polarity latch 18 in response either to the signals from two comparators 20 and 22 or to a manually-operable switch 24. The comparators 20 and 22 are coupled, inversely relative to one another, to two input/output terminals 26 and 28. These two terminals 26 and 28 also constitute the power supply terminals of the apparatus, the d.c. power being separated from input and output signals by two chokes 30 and 32 for supply to the various parts of the apparatus along appropriate conductors (omitted for clarity).

Operation of the current source 14 or the current sink 16 is triggered by a timing circuit 34, and can be inhibited by a signal on an input terminal 36.

The timing circuit 34 operates in accordance with a control signal on an input terminal 38 to trigger the respective one of the source 14 and the sink 16 selected by the polarity latch 18, either continuously at approximately 1 kHz (internal operation), or selectively in response to a signal from an OR-gate 40 which has two inputs coupled to respective ones of the comparators 20 and 22 (external operation). The input terminal 38 is also coupled to the polarity latch 18 to control it to respond either to the comparators 20 and 22 (for external operation) or to the switch 24 (for internal operation). Once the timing circuit 34 has triggered one of the source 14 and the sink 16, it temporarily inhibits further operation of the comparators 20, 22 via a control line 41.

The apparatus also has a current sensing circuit 42, in which a coil 44 is wound on the centre portion of a U-shaped (or bifurcated) ferrite core indicated very schematically at 46. The ends of the coil 44 are coupled to a sense amplifier 48 which drives oppositely sensed inputs of two comparators 50 and 52. These comparators also receive opposite polarity reference voltages V+ and V− respectively, and their outputs are coupled to a display logic circuit 54 which also receives the output signals of the polarity latch 18 in the current supply circuit 10.

The display logic 54 responds to these input signals to energise an appropriate one of two light-emitting diode direction indicators 56 and 58, via respective latches 60 and 62 which are enabled by the timing circuit 34.

The outputs of the comparators 50 and 52 are also connected to a differential output amplifier 64 which supplies corresponding oppositely-sensed signals to the input/output terminals 26 and 28: these signals are prevented from affecting the polarity latch 18 by the fact that the operation of the comparators 20, 22 is temporarily inhibited as mentioned earlier.

The design of each of the above-mentioned circuits will be obvious to one skilled in the art in the light of the following description, and need not be discussed in detail here.

In use, the circuit under test is energised and set to the state in which a fault is observed, the current injection probe 12 is placed on a printed circuit conductor forming part of the node where the fault is present, and a pulse of current is injected into the conductor. Assuming that the control signal on the terminal 38 is selecting external operation, the injection of the current pulse will be triggered by the timing circuit 34 in response to a pulse on one of the terminals 26 and 28, acting via the appropriate one of the comparators 20 and 22 and the OR-gate 40. At the same time, polarity latch 18 responds to the appropriate comparator to enable either the current source 14 or the current sink 16 in accordance with the polarity of the trigger pulse.

The magnitude of the current pulse is limited to 1 milliampere, which is insufficient to cause any change in the state of the logic circuits of the circuit under test. Typically, for transistor-transistor logic (TTL) circuits, a pulse from the current source 14 will cause a positive-going voltage pulse of approximately 100 mV maximum magnitude, as compared with the maximum 800 mV threshold permitted for a signal to represent a logic 0 input signal (assuming positive logic). Similarly, a pulse from the current sink 16 will cause a negative-going pulse also of approximately 100 mV maximum magnitude from a worst case logic 1 output signal of 2.8 volts, compared with the minimum 2.4 volts which is accepted as a logic 1 input signal.

The ends of the U-shaped ferrite core 46 are simultaneously placed on or just above the printed circuit conductor, so that the magnetic field associated with the pulse of current flowing therethrough can induce a corresponding voltage pulse across the coil 44.

This pulse acts via the amplifier to trigger one or other of the comparators 50 and 52 in accordance with the polarity of the pulse, which will in turn depend on the direction of the magnetic field inducing the pulse. However, the direction to the fault (as distinct from the direction of current flow to or from the fault) is related not only to the polarity of the voltage pulse, but also to the polarity of the test current pulse. Accordingly, the display logic 54 receives a signal both from the triggered comparator 50 or 52 and from the polarity latch 18, and by comparison of these signals supplies a signal to the appropriate one of the indicators 56 and 58 to indicate the direction to the fault. The indication is maintained by means of the latches 60 and 62 which are enabled at an appropriate time after injection of the test current pulse by the timing circuit 34.

In the internal mode of operation, the test current pulses are triggered automatically by the timing circuit 34 at a rate of 1 kHz and with a polarity dependent on the setting of the switch 24.

If the apparatus is being used, in the external mode of operation, in conjunction with an automatic test equipment which supplies the sequence of test signals mentioned earlier, such as the Applicants type MB 2400 series or MB 7700 series automatic test equipment, the test equipment is arranged to conduct the sequence of test steps, so as to identify and store the number of the steps at which the circuit under test enters the faulty state. The test equipment is then caused to repeat the sequence, triggering the apparatus shown in FIG. 1, via the terminals 26 and 28, when the identified step recurs, thus applying the test current pulse while the circuit under test is in the faulty state: circuitry for achieving this triggering will be described hereinafter with reference to FIG. 4. The resulting signal supplied to the automatic test equipment via the amplifier 64 and the terminals 26 and 28 enables the equipment to diagnose the fault or select further test steps as necessary.

Figure 2:
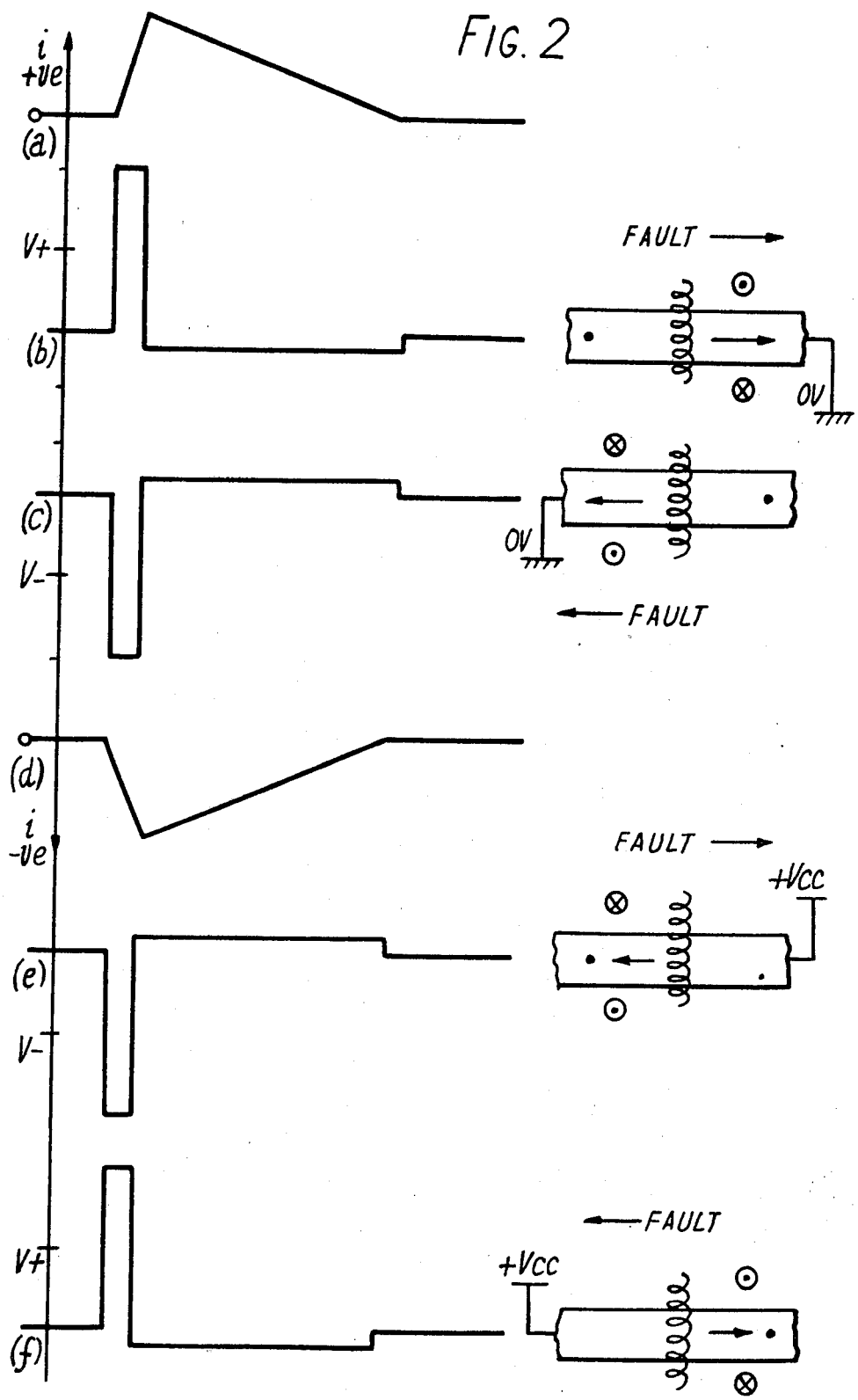
FIG. 2 shows somewhat idealised versions of waveforms appearing in the circuit of FIG. 1.

The current pulses supplied by the circuits 14 and 16 have an approximately triangular waveform, as shown in somewhat idealised form in FIG. 2, in which the leading edge is very steep (typical rise time 10 nanoseconds) and the trailing edge is much less steep (typical fall time 200 nanoseconds). Although the trailing edges of the pulses are shown in FIG. 2 as being substantially linear, they are in practice approximately exponential, since the pulses are typically each shaped by means of a respective simple differentiating circuit of the series capacitance, shunt resistance type disposed within the respective circuit 14 or 16 and arranged to receive a step input signal triggered by the timing circuit 34. As also shown in FIG. 2, the resulting voltage pulse induced in the coil 44 has a short, high-amplitude excursion of one sense followed by a longer but lower-amplitude excursion of the other sense. Thus, appropriate selection of the magnitudes of V+ and V− enables the sense of the first excursion (and thus of the direction of flow of the test current pulse) to be readily distinguished. The voltage pulses induced in the coil 44 are again shown in somewhat idealised form in FIG. 2: in practice, they are shaped by the inductance and stray capacitance of the coil 44 so as to appear as damped sinusoidal pulses, with the first half cycle much greater in amplitude than the second.

FIG. 2 also shows the relationships between direction of current flow, polarity of test current, and fault direction. Thus, referring to FIGS. 2b and 2c, for a positive-going test current pulse, current flow to the right or left indicates (for an appropriate orientation of the ferrite core 46) a fault to the right or left respectively. Conversely, for a negative-going test current (FIGS. 2e and 2f), current flow to the right or left indicates a fault to the left or right respectively. The display logic 54 includes a simple arrangement of gates and latches designed to implement these relationships.

Note that if the ferrite core 46 is rotated axially through 180°, the polarity of the voltage pulse induced in the coil 44 is also reversed, thus interchanging the states of the indicators 56 and 58. However, if these indicators are mounted on the same support as the core 46, on opposite sides of its axis 66, their positions are also interchanged, thus maintaining the correct indication.

One form of the apparatus constructed in this manner is shown in FIG. 3, in which parts corresponding to those in FIG. 1 have corresponding reference numerals prefixed by 1.

Referring to FIG. 3, the various parts of the circuit are mounted on an elongate printed circuit board 100 within a tubular housing 102, through the wall of which project the indicators 156 and 158 and the switch 124. The bifurcated ferrite core 146 is mounted at one end of the housing 102, with the current injection probe 112, in the form of a metal plate ending in a point 104, projecting down between the limbs of the core 146: for the sake of clarity, the ferrite core 146 is shown rotated through 90° in FIG. 3, in order to render the current injection probe 112 visible, but in practice the limbs of the core 146 and the probe 112 lie in a common plane perpendicular to the plane of FIG. 3. Thus, the apparatus can be placed with one hand on a conductor 106 of a circuit board 108 under test, whereupon the current injection probe 112 and the ferrite core 146 are simultaneously correctly positioned for the injection of a test current pulse.

The automatic test equipment (A.T.E.) of FIG. 4 is indicated generally at 200, and may for example comprise type MB 7700 series A.T.E. as manufactured and sold by the Applicant. The A.T.E. 200 is shown connected via a bus 202 to a complex digital circuit under test, which is indicated at 204 and which may typically comprise a large number of LSI circuits (not shown) mounted on a printed circuit board (not shown). The board of the circuit 204 is normally mounted in its usual edge connector (not shown), and the bus 202 is connected to this edge connector. As is well known, the A.T.E. 200 is programmed to provide the circuit 204, via the bus 202, with its required power supplies and a sequence of test signals, and to monitor the response of the circuit 204 to these test signals in order to detect any faults which may be present in the circuit.

The A.T.E. 200 is provided with interface circuitry, generally indicated at 206, for interfacing the A.T.E. to the apparatus of FIGS. 1 and 3. The circuitry 206 comprises a data transceiver 208 for receiving data from and transmitting data to the A.T.E. 200 (specifically from and to a central processor therein), the data transceiver 208 being connected to apply data it receives from the A.T.E. 200 to a data write unit 210. The data write unit 210 has three outputs 212, 214, 217, which are respectively connected to the input/output terminals 26, 28 and the input terminal 38 of the apparatus of FIGS. 1 and 3, and a fourth output 215 connected to the terminal 36 of this apparatus. The terminals 26, 28 are also connected to two inputs 216, 218 of a data read unit 220, whose outputs are commoned with the inputs of the data write unit 210 and connected to the data transceiver 208.

The A.T.E. 200 has an output 222 at which it produces test pulses each synchronised with a respective step of the sequence of test signals being applied to the circuit 204, this output being connected to the count input of a test number counter 224. The count outputs of the counter 24 are connected to a first set of inputs of a comparator 226, and to the inputs of a latch 228, whose outputs are connected to the other set of inputs of the comparator 226.

The A.T.E. 200 has a further output 230 at which it produces a pulse, synchronised with a test pulse, when it detects a fault in the circuit 204. The output 230 is connected to an enabling input of the latch 228.

The output of the comparator 226 is connected to one input of a two-input AND gate 232, whose other input is connected to the output 222 of the A.T.E. 200 and whose output is connected to a further input of the data write unit 210.

In operation, the A.T.E. 200 is set to run through the sequence of test signals for a first time, and as it does so, the count in the counter 224 is incremented by one for each successive step in the sequence: the count in the counter 224 is thus indicative of the number in the sequence of the test signal actually being applied to the circuit 204 at any instant. On this first run through the sequence, operation of the apparatus of FIGS. 1 and 3 is inhibited, if appropriate, by a signal applied by the A.T.E. 200 to its input terminal 36 via the data transceiver 208 and the data write unit 210.

Suppose that on step number 27 of the sequence, the A.T.E. 200 detects a fault in the circuit 204. Besides storing details of the fault for diagnostic purposes, the A.T.E. 200 produces a "fault detected" pulse at its output 230, which pulse is operative to strobe the count in the counter 224, currently 27, into the latch 228: the sequence then continues to its end. Suppose further that an initial diagnosis, based on the known operating characteristics of the circuit 204 and perhaps involving probing the voltages at various points in the circuit, indicates that the fault is associated with a particular circuit conductor or node to which several LSI circuits are connected. The A.T.E. 200 will instruct the operator to place the probe 12/112 of the apparatus of FIGS. 1 and 3 on the node in question, and from preprogrammed information relating to the nature of the circuits connected to the node, will enable the appropriate one of the outputs 212, 214 of the data write unit 210 (corresponding to the appropriate one of the source 14 and sink 16 in the apparatus of FIGS. 1 and 3) by way of the data transceiver 208.

The A.T.E. 200 is then set to run through the sequence of test signals again. When it reaches step 27 of the sequence, ie the step at which the fault appears, the comparator 226 produces an output signal which enables the AND gate 232. The test pulse present on the other input of the AND gate thus triggers the apparatus of FIGS. 1 and 3, via the enabled one of the outputs 212, 214 of the data write unit 210 and the corresponding one of the inputs 26, 28, to apply a current pulse to the node in question, with the results described earlier in relation to FIGS. 1 to 3. In particular, the resulting output signal appearing at the terminals 26, 28 is transmitted back to the A.T.E. 200 via the data read unit 220 and the data transceiver 208. The operator can repeat this process (which is extremely rapid) several times as he explores different parts of the node, until he has determined the precise location of the fault.

It will be appreciated that this technique is particularly valuable for locating transient faults, since it ensures that the fault locating current pulse is applied at an instant when the fault is known to be present. The current pulse injection technique has the further advantage that the effects of a relatively small current pulse can be detected even in the presence of a larger D.C. current.

Many modifications can be made to the described embodiments of the invention. For example, the current probe 112 can if desired be separated from the rest of the apparatus of FIG. 3, ie current can be injected at one point in the conductor or node and its effects sensed at another point in the same conductor or node. Also, both of the indicators 156, 158, which typically comprise light-emitting diodes, may be on the same side of the housing 102 and associated with (or shaped like) arrows: one arrow points down, to indicate that the fault lies in the portion of the conductor or node on the side of the housing 102 carrying the indicators, while the other points up, to indicate that the fault lies in the portion of the conductor or node on the other side of the housing 102.

Moreover, the apparatus of FIGS. 1 and 3 can be adapted for use as a voltage probe as well as a current probe, in which case it can be arranged to stop applying a current pulse and/or to provide a warning if the logic state at the point of application of the current pulse starts to change in response to the current pulse; alternatively, the current source 14 and current sink 16 can be voltage-limited, so as to further ensure they cannot change the logic state of the circuit under test.

Further, the latch 228 of FIG. 4 can if desired be operator-settable, in response to information displayed by the A.T.E. 200, rather than (or as well as) being automatically settable by the A.T.E.

We claim:
1. A method of testing a powered electronic circuit, the method comprising:
   applying a sequence of test signals to said circuit;
   storing, in response to the detection of a fault in said circuit during the application of said sequence of test signals, the number of the step in said sequence at which the fault occurred;
   repeating the application of said sequence of test signals to the circuit while applying triggerable current pulse applying means to a conductor of the circuit associated with the fault;

automatically triggering said current pulse applying means to apply a current pulse of predetermined sense to said conductor when said sequence reaches the step whose number was stored; and determining the direction of flow of said current pulse along the conductor, whereby to permit the determination of the direction of the fault with respect to the point on the conductor at which the pulse is applied.

2. A method as claimed in claim 1, wherein the current pulse has an approximately triangular waveform with a relatively steep leading edge and a relatively less steep trailing edge, and the step of determining the direction of flow of said current pulse along the conductor comprises sensing magnetic field changes induced adjacent to said conductor by the leading edge of said pulse, and producing, in response to the sense of said magnetic field changes, a signal indicative of said direction of flow.

3. A method as claimed in claim 1, further including automatically effecting said determination of the direction of the fault in response to the predetermined sense of said current pulse and the direction of flow thereof along the conductor.

4. A method as claimed in claim 1, wherein the magnitude of said current pulse is selected to be insufficient to alter the logical state of said circuit.

5. Apparatus for testing a powered electronic circuit, the apparatus comprising:

means for applying a sequence of test signals to said circuit;

means for storing, in response to the detection of a fault in said circuit during the application of said sequence of test signals, the number of the step in said sequence at which the fault occurred;

triggerable means for applying a current pulse of predetermined sense to a conductor of the circuit associated with the fault;

triggering means responsive to said test signal applying means and said storing means and coupled to the current pulse applying means to trigger the application of such a pulse when said sequence, during a subsequent application thereof to the circuit, reaches the step whose number was stored; and means responsive to said triggering means and arranged to determine the direction of flow of said current pulse along the conductor, whereby to permit the determination of the direction of the fault with respect to the point on the conductor at which the pulse is applied.

6. Apparatus as claimed in claim 5, wherein the current pulse applying means is arranged to produce a current pulse having an approximately triangular waveform with a relatively steep leading edge and a relatively less steep trailing edge, and the means for determining the direction of current flow comprises means arranged to sense magnetic field changes induced adjacent to said conductor by the leading edge of said pulse and means responsive to the sense of said magnetic field changes to produce a signal indicative of said direction of current flow.

7. Apparatus as claimed in claim 5, further comprising means responsive to the predetermined sense of said current pulse and the direction of flow thereof along the conductor to determine and indicate the direction of the fault.

8. Apparatus as claimed in claim 6, wherein said current pulse applying means includes a differentiating circuit arranged to produce said triangular waveform at its output in response to a step signal at its input.

9. Apparatus as claimed in claim 6, wherein the sensing means comprises a coil wound upon a bifurcated core, and the current pulse applying means includes a conductive member disposed between the limbs of said core.

10. Apparatus as claimed in claim 5, wherein the magnitude of said current pulse is selected to be insufficient to alter the logical state of said circuit.

* * * * *